(12) United States Patent
Kobayashi

(10) Patent No.: US 7,130,021 B2
(45) Date of Patent: Oct. 31, 2006

(54) EXPOSURE APPARATUS, AND DEVICE MANUFACTURING METHOD

(75) Inventor: Daisuke Kobayashi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/101,311

(22) Filed: Apr. 7, 2005

(65) Prior Publication Data

US 2005/0231703 A1  Oct. 20, 2005

(30) Foreign Application Priority Data

Apr. 7, 2004 (JP) .............................. 2004-113142

(51) Int. Cl.
  *G03B 27/74* (2006.01)
  *G03B 27/42* (2006.01)
  *G03B 27/52* (2006.01)
(52) U.S. Cl. ............................. 355/68; 355/53; 355/55
(58) Field of Classification Search .................. 355/53, 355/55, 67–71; 356/399–401; 250/548
See application file for complete search history.

(56) References Cited

U.S. PATENT DOCUMENTS 6,333,777 B1 * 12/2001 Sato ............................ 355/53
6,710,856 B1 * 3/2004 Van Der Laan et al. ...... 355/71
6,768,546 B1 * 7/2004 Sato ............................ 356/399
7,009,681 B1 * 3/2006 Shinoda ....................... 355/53

FOREIGN PATENT DOCUMENTS

JP  11-087232 A   3/1999
JP  11-087232 A5  3/1999

* cited by examiner

*Primary Examiner*—Henry Hung Nguyen
(74) *Attorney, Agent, or Firm*—Morgan & Finnegan, LLP

(57) ABSTRACT

Disclosed is a scan type exposure apparatus for exposing a substrate, placed on an exposure plane, to a pattern of a mask with light from a light source. In one preferred embodiment, the apparatus includes a stop member for restricting an exposure range on the exposure plane, a measuring system for measuring an illuminance distribution which is produced on a predetermined plane displaced from the exposure plane in an optical axis direction and by a predetermined amount and which is provided by light passed through an opening of the stop member and projected or to be projected at a predetermined position on the exposure plane, and a calculating device for calculating an angular characteristic of light projected or to be projected on the exposure plane, on the basis of integrating illuminance distributions which are defined by lights incident at plural positions along a scan direction upon the exposure plane and which are measured by the measuring system.

12 Claims, 6 Drawing Sheets

EXPOSURE APPARATUS, AND DEVICE MANUFACTURING METHOD

FIELD OF THE INVENTION AND RELATED ART

This invention relates generally to an exposure apparatus and a device manufacturing method using the same. More particularly, the invention concerns an exposure apparatus and a device manufacturing method using the same, suitably usable in a lithographic process for manufacture of semiconductor devices, liquid crystal display devices, etc.

Recent projection exposure apparatuses for manufacture of semiconductor devices, particularly, those designed to accomplish higher degree of integration such as VLSI, for example, are strictly required to achieve extraordinarily high transfer precision for the circuit pattern printing. One of the factors that satisfy this requirement is appropriately setting the angular distribution of exposure light incident on a wafer. Various proposals have been made in relation to a method of measuring this angular distribution. An example is Japanese Laid-Open Patent Application, Publication No. 11-087232 and corresponding U.S. Pat. No. 6,333,777.

In accordance with this patent document, for measurement of the incidence angular distribution of exposure light (effective light source distribution) at a single point on a wafer, a masking blade disposed at a position being conjugate with the wafer is used to set a small hole-like opening at the position corresponding to the single point, while on the other hand a detector is placed on a plane being displaced from the wafer surface in the optical axis direction, such that an intensity distribution corresponding to the incidence angular distribution of the illumination light impinging on the small opening appears on the detector.

On the other hand, in scan type exposure apparatuses wherein exposure process is carried out while scanningly moving a mask and a wafer, the incidence angular distribution of exposure light (effective light source distribution) being integrated at a single point may differ from that to be produced in the non-scan (stationary) state. Nevertheless, the effective light source distribution conventionally measured is just the one defined in the stationary state. Any influences of the scanning operation in the scan type exposure apparatus have never been taken into account.

SUMMARY OF THE INVENTION

It is an object of the present invention to provide a scan type exposure apparatus by which an effective light source distribution in a scan period can be measured.

In accordance with an aspect of the present invention, there is provided an exposure apparatus for exposing a substrate, placed on an exposure plane, to a pattern of a mask with light from a light source, said apparatus comprising: a stop member for restricting an exposure range on the exposure plane; measuring means for measuring an illuminance distribution which is produced on a predetermined plane displaced from the exposure plane in an optical axis direction and by a predetermined amount and which is provided by light passed through an opening of said stop member and projected or to be projected at a predetermined position on the exposure plane; and calculating means for calculating an angular characteristic of light projected or to be projected on the exposure plane, on the basis of integrating illuminance distributions which are defined by lights incident at plural positions along a scan direction upon the exposure plane and which are measured by said measuring means.

In accordance with another aspect of the present invention, there is provided a scan type exposure apparatus for exposing a substrate, placed on an exposure plane, to a pattern of a mask with light from a light source, said apparatus comprising: a stop member for restricting an exposure range on the exposure plane; a two-dimensional sensor array disposed at a position corresponding to a Fourier transform plane with respect to the exposure plane; and a detector for detecting an intensity distribution, on the Fourier transform plane, of light passed through a slit-like opening of said stop member, being elongated in a scan direction.

In accordance with a further aspect of the present invention, there is provided an exposure apparatus for exposing a substrate, placed on an exposure plane, to a pattern of a mask with light from a light source, said apparatus comprising: a stop member disposed on a first predetermined plane which is displaced from a second predetermined plane, being conjugate with the exposure plane, in an optical axis direction and by a predetermined amount; and measuring means for measuring an illuminance distribution which is produced on the exposure plane by light passed thorough an opening of said stop member; wherein, at the second predetermined plane being conjugate with the exposure plane, a numerical aperture of the light is not greater than 0.25.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

[Embodiment 1]

Figure 1:
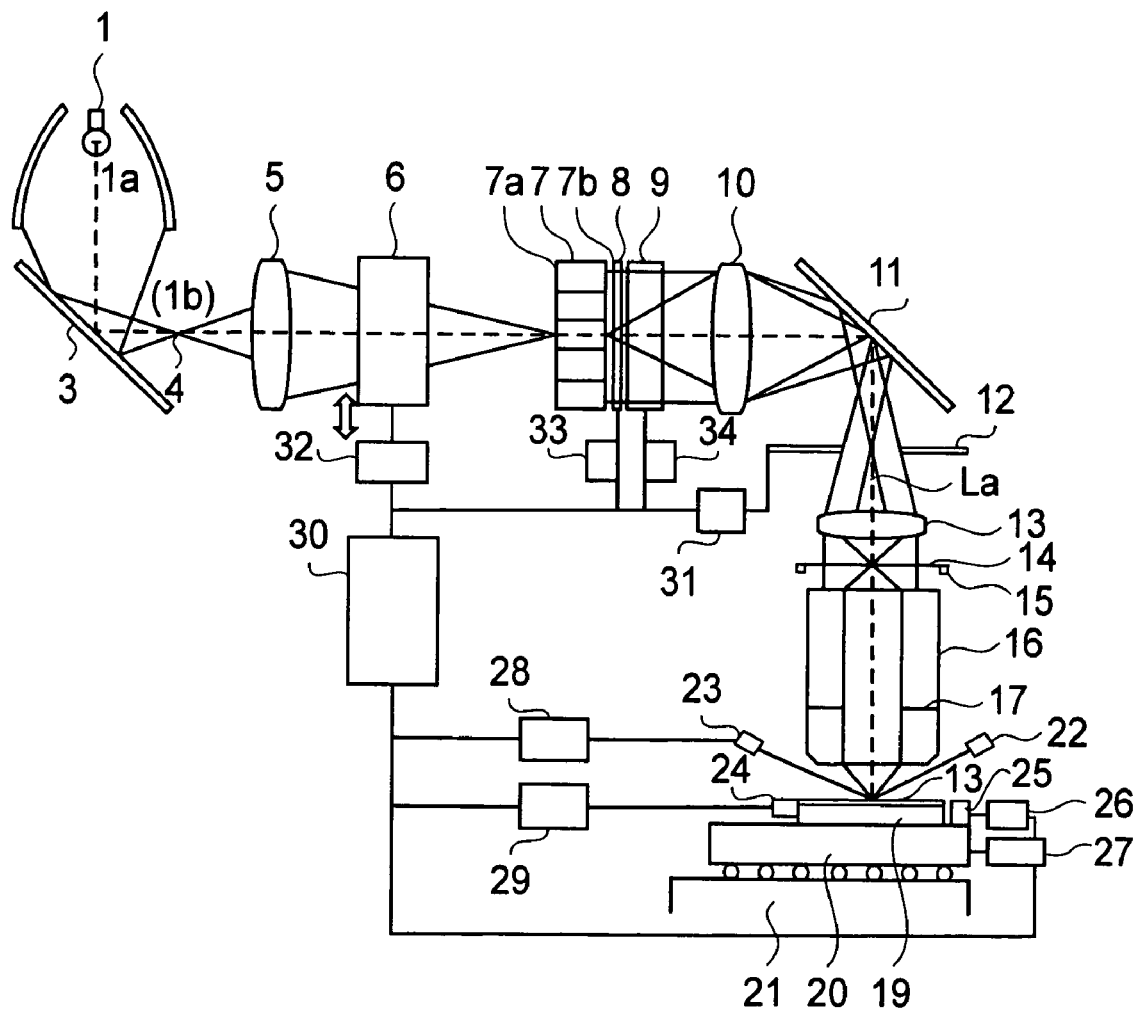
FIG. 1 is a schematic view of an optical arrangement according to the present invention.

FIG. 1 is a schematic view of a main portion of a first embodiment of the present invention. In this embodiment, the invention is applied to a step-and-scan type projection exposure apparatus to be used in a lithographic process for submicron or quarter-micron order.

Denoted in the drawing at 1 is a light emitting tube such as Hg lamp, for example, and it has a high-luminance light emitting portion 1a for emitting ultraviolet rays or deep ultraviolet rays, for example. The light emitting portion 1a is disposed at or adjacent a first focal point of an elliptical mirror 2, and the light emitting portion 1a is imaged (at 4) at or adjacent a second focal point of the elliptical mirror 2. Denoted at 3 is a cold mirror which comprises a multilayered film having a function for transmitting most of infrared light therethrough but for reflecting most of ultraviolet light. The elliptical mirror 2 functions to form an image (light source image) 1b of the light emitting portion 1a through the cold mirror 3, at or adjacent the second focal point thereof (at 4). The light source means comprising the components denoted at 1–4 in the drawing may be replaced by an excimer laser that supplies light of a wavelength 248 nm (KrF) or 193 nm (ArF).

Denoted at 5 is an imaging optical system that comprises a condenser lens, a collimator lens and a zoom lens, for example. The imaging optical system 5 functions to image the light emitting portion image 1b formed (at 4) at or adjacent the second focal point, upon a light entrance surface 7a of an optical integrator (secondary light source forming means) 7 and through a lens system (adjusting means) 6.

The lens system 6 has a function as adjusting means for adjusting the incidence angle of illumination light, impinging on a surface to be illuminated (e.g., mask surface), and it can be moved two-dimensionally in an optical axis direction and along a plane perpendicular to the optical axis, by use of lens system driving means 32.

The optical integrator 7 comprises a plurality of small lenses having a rectangular sectional shape and being arrayed two-dimensionally with a predetermined pitch. A plurality of secondary light sources are produced adjacent a light exit surface 7b thereof. There is a stop 8 adjacent the light exit surface 7b of the optical integrator 7, and the size and shape of the stop 8 can be changed by means of a stop driving mechanism 33.

Denoted at 9 is illuminance non-uniformness correcting means (correcting means) which serves to correct any illuminance non-uniformness upon the surface 14 to be illuminated. Denoted at 10 is a condenser lens for collecting light beams emitted from the secondary light sources, adjacent the light exit surface 7b of the optical integrator 7. The collected light beams are reflected by a mirror 11 and then superposedly projected upon the plane of a masking blade 12 to uniformly illuminate that plane.

The masking blade 12 comprises a plurality of movable light blocking plates that can be moved by masking blade driving means 31 to variably define a desired opening shape, thereby to restrict the exposure range upon the surface of a wafer 18 which is a substrate to be exposed. Denoted at 13 is an imaging lens that functions to transfer the shape of the opening of the masking blade 12 onto the surface of a mask (reticle) 14 which is also a surface to be illuminated, thereby to uniformly illuminate a necessary region on the mask 14 surface. The mask 14 is held by a mask stage 15.

Denoted at 16 is a projection optical system (projection lens) for projecting a circuit pattern formed on the mask 14 surface in a reduced scale. It comprises an exit-side telecentric system. Denoted at 17 is a pupil of the projection optical system 16, and denoted at 18 is a wafer (substrate) onto which the circuit pattern of the mask 14 is going to be projected and transferred. The wafer 18 is placed on an exposure plane. Denoted at 19 is a wafer chuck for holding the wafer 18 thereon and being movable in an optical axis direction. Denoted at 20 is an X-Y stage for holding the wafer chuck 19 thereon and being movable two-dimensionally along a plane orthogonal to the optical axis. Denoted at 21 is a base table on which the projection lens 16, X-Y stage 20 and so on are placed. The X-Y stage is arranged so that it can be moved along the optical axis La direction by a predetermined amount, for measurement of angular characteristics of the illumination light, to be described later.

In the optical structure according to this embodiment, the light emitting portion 1a, the second focal point 4, the light entrance surface of the optical integrator 7, the masking blade 12, the mask 14 and the wafer 18 surface are placed in an approximately conjugate relationship. Furthermore, the light exit surface of the stop 8 and the pupil plane 17 of the projection optical system 16 are placed in an approximately conjugate relationship.

Denoted at 22 and 23 are components of a surface position detecting system for detecting positional (level) information of the wafer 18 surface with respect to the optical axis direction. More specifically, denoted at 22 is an illuminating device for illuminating the wafer 18 in an oblique direction, and denoted at 23 is a light receiving device for receiving reflection light from the wafer 18 surface and for outputting a signal corresponding to the surface position of the wafer 18. Denoted at 28 is a control device for controlling the illuminating device 22 and the light receiving device 23.

Denoted at 25 is a reflection mirror fixedly provided on the X-Y stage 20, and denoted at 26 is a laser interferometer for projecting a laser beam onto a reflection surface of the reflection mirror 25 to detect the amount of displacement of the X-Y stage 20. Denoted at 27 is driving means for controlling the movement of the X-Y stage 20 in response to an output signal from the laser interferometer 26.

The driving means 27 receives surface positional information related to the surface level of the wafer 18 from the control device 28, and it moves the wafer chuck 19 in the optical axis direction thereby to bring the wafer 18 surface in registration with the imaging plane of the device pattern of the mask 14 defined by the projection lens system 16.

Denoted at 24 is a detector (illuminometer or sensor) for detecting an angular distribution of illumination light impinging on the wafer 18 surface and an illumination distribution on that surface. The detector 24 is made movable within the irradiated frame region together with the motion of the X-Y stage while its light receiving portion being kept registered with the wafer 18 surface, and it supplies a signal corresponding to its output to a detecting system 29. The illuminometer 24 is made movable along the optical axis La direction.

Denoted at 30 is a main control unit for controlling the component devices 27, 28, 29, 31, 32, 33 and 34 described above. The information supplied by the detecting system 29 is applied to this main control unit 30.

The illuminometer 24 is provided to measure the light intensity distribution at a position displaced from the exposure plane, as well as asymmetry of the light intensity distribution with respect to the exposure optical axis. On the basis of the results of detection by this illuminometer 24, the lens system (adjusting means) 6 is driven to adjust the light intensity distribution and its asymmetry with respect to the exposure optical axis.

In this embodiment, the masking blade 12 is operable to change the shape of its opening so that a deviation of the principal ray of exposure light appears on a plane 18b, displaced from the exposure plane 18a (FIG. 2) along the optical axis La direction of the projection optical system 16. The illuminometer 24 very measures this deviation of the principal ray.

Furthermore, in this embodiment, the illuminometer (detector) 24 measures the amount of tilt of the principal ray of exposure light with respect to the optical axis La of the projection optical system 16. On the basis of a signal from the illuminometer 24, the lens system (adjusting means) 6 is driven to adjust the tilt angle of the principal ray of exposure light.

Measurement of angular distribution using such mechanism as described above has been proposed in Japanese Laid-Open Patent Application, Publication No. 11-087232 and corresponding U.S. Pat. No. 6,333,777. In accordance with the proposed method, where an angular distribution of illumination light at the center of picture plane (optical axis La position) is to be measured, for example, the masking blade may be driven to restrict and make small the opening thereof, so that slight illumination light can pass through only at the optical axis La position. Simultaneously, the detector may be moved approximately to the optical axis La position and, additionally, it may be moved downwardly through a predetermined distance from the actual wafer surface position.

This method is really effective in step-and-repeat type projection exposure apparatuses. However, in scan type or step-and-scan type projection exposure apparatuses, this method is ineffective to measure the effective light source in the scan operation that determines the image performance in the scan.

Hence, in the exposure apparatus according to this embodiment, a plurality of openings are defined at plural positions to enable measurement of an effective light source distribution with the influences of the scan being taken into consideration, and at each position the emission (incidence) angular characteristic is measured. Furthermore, there is calculating means provided to integrate the results of measurements. The plural positions mentioned above may be those positions defined rectilinearly along the scan direction and at a predetermined image height with respect to a direction orthogonal to the scan direction.

Figure 2:
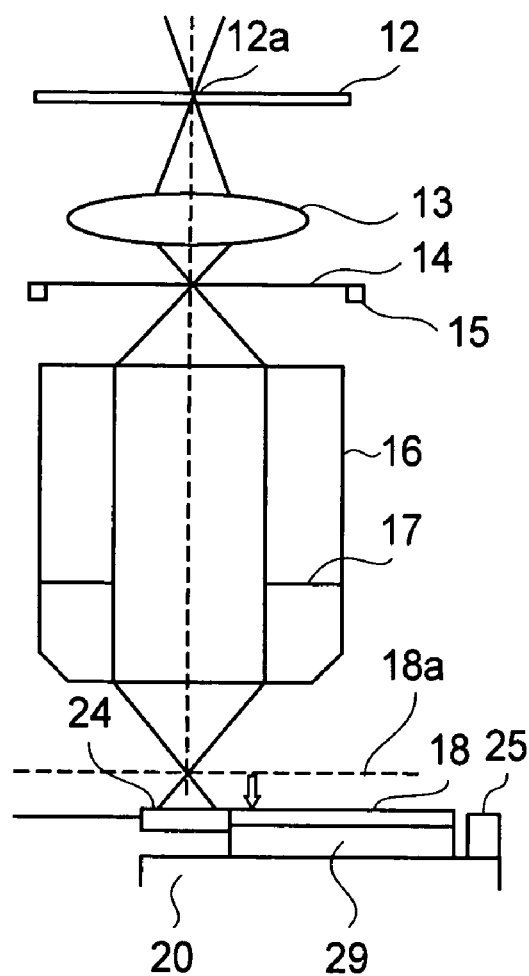
FIG. 2 is a fragmentary view of a portion of FIG. 1, which is arranged in accordance with a first embodiment of the present invention.
Figure 3:
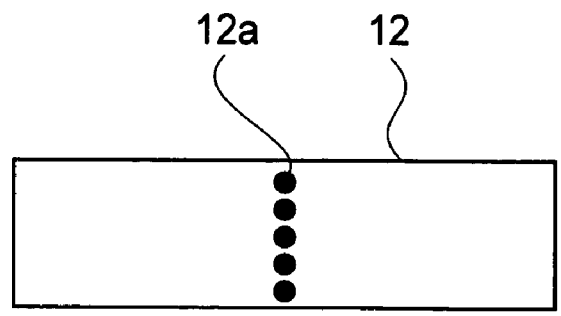
FIG. 3 is a schematic view for explaining openings of a masking blade, in the first embodiment of the present invention.

Referring to FIG. 2, an example wherein the effective light source of illumination light at the picture plane center (optical axis La position) is going to be measured, will be explained. The plural positions in this case may be, as shown in FIG. 3, those which are defined rectilinearly along the scan direction from the optical axis La position. In step-and-scan type exposure apparatuses, the light that illuminates a single point on a wafer can be regarded as having passed along a straight line that contains these plural positions. In respective measurements, the masking blade driving means 31 operates to actuate the masking blade 12 to restrict and make small the opening 12a thereof to assure that slight illumination light passes only the position going to be measured. Also, in respective measurements, the detector 24 is moved to the position of each point going to be measured and, in addition, it is placed below the exposure plane 18a by a predetermined distance.

Only the illumination light from the opening 12a being restricted by the masking blade 12 can pass through the exposure plane 18a and reach the detector 24. Here, the light intensity is measured by the detector 24 while moving the X-Y stage 20 two-dimensionally along a plane perpendicular to the optical axis La. Then, the results of measurements made at the plural positions are integrated by use of the calculating means. By the procedure described above, the angular characteristic of illumination light during the scan operation can be detected.

Where the effective light source of illumination light at any point on the exposure plane 18a other than the optical axis La position is going to be measured, the plural positions may be those defined rectilinearly in the scan direction from the position corresponding to the point just to be measured, in the masking blade plane. By changing the shape of the masking blade 12 opening sequentially in accordance with the respective plural positions, a hole-like small opening can be set. Simultaneously, the position of the detector 24 may be shifted.

The detector 24 includes an opening having a predetermined size as well as a photodetector for measuring the intensity of light incident through that opening. By moving this opening and the photodetector as a unit adjacent the exposure plane and in a direction perpendicular to the optical axis, the detector 24 measures the illuminance distribution there. In order to cancel adverse influences of any non-uniformness in the sensitivity of the photodetector, a lens may be inserted into between the aforementioned opening and the photodetector to place the opening and the photodetector in an approximately conjugate relationship.

As an alternative, the detector 24 may comprise a sensor array having sensor surfaces disposed adjacent the exposure plane. The sensor array may be an array of one-dimensional (linear) sensors disposed along the scan direction. While moving this sensor array in a direction perpendicular to the scan direction by means of the stage 20, outputs of respective picture elements are obtained. This measurement is repeated with respect to the plural positions described above and, through subsequent integration using the calculating means, the effective light source of illumination light during the scan operation can be detected.

As a further alternative, the detector 24 may comprise an array of two-dimensional (area) sensors having sensor surfaces disposed adjacent the exposure plane. Two-dimensional outputs of the respective picture elements are obtained in this example. This measurement is repeated with respect to the plural positions described above and, through subsequent integration using the calculating means, the effective light source of illumination light during the scan operation can be detected.

In the examples described above, a detector 24 for detecting the angular distribution of illumination light impinging on the wafer 18 surface as well as the illuminance distribution on that plane is used to measure the effective light source. However, a separate detector may be used and disposed adjacent the wafer surface.

[Embodiment 2]

Figure 4:
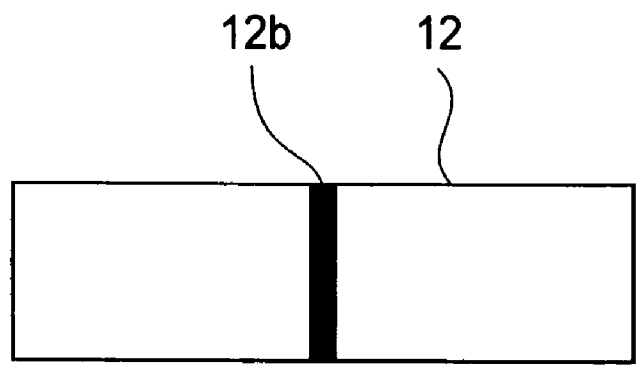
FIG. 4 a schematic view for explaining openings of a masking blade, in a second embodiment of the present invention.
Figure 5:
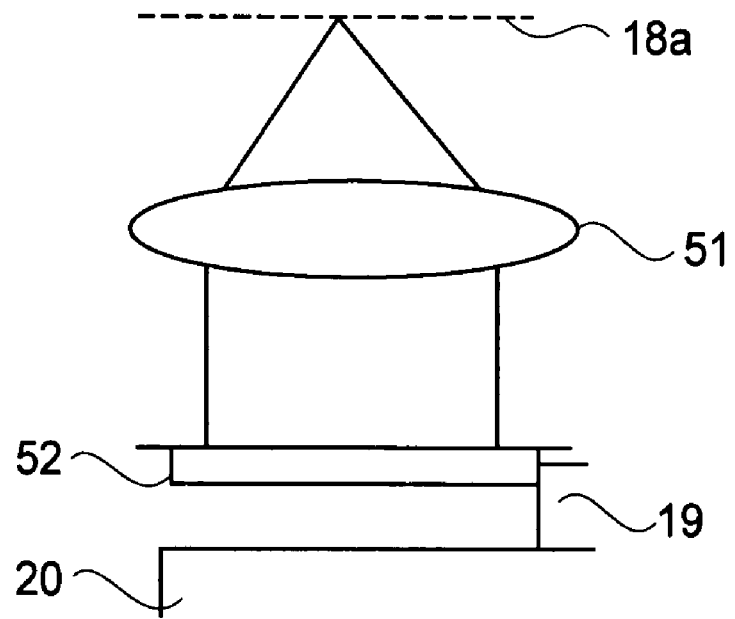
FIG. 5 is a fragmentary and schematic view of an optical system used in the second embodiment of the present invention.

A second embodiment of the present invention will be described below. As has been explained above, in scan type exposure apparatuses, the light that illuminates a single point on a wafer surface corresponds to what can be provided by integrating light beams passed through a straight line parallel to the scan direction, in the wafer illumination region. Hence, in accordance with the second embodiment of the present invention, as shown in FIG. 4 the opening 12b of the masking blade 12 is shaped into a slit-like shape being elongated in the scan direction, that does not restrict the illumination range, with respect to the scan direction, of the illumination shape on the exposure plane. Additionally, as shown in FIG. 5, the detector 24 is replaced by a two-dimensional sensor array 52. Here, the sensor array 52 is disposed at a position optically corresponding to a Fourier transform plane with respect to the exposure plane 18a. To assure this, a lens system 51 is provided between the exposure plane 18a and the two-dimensional sensor array 52. The intensity distribution, at the above-described Fourier transform plane, of all the lights having passed through the slit-like opening 12*b* is measured.

Where the effective light source of illumination light at the picture plane center (optical axis La position) is going to be measured, for example, the masking blade driving means 31 actuates the masking blade 12 to define, at the optical axis La position, a slit-like opening 12*b* being elongated in the scan direction.

The light passing through this opening 12*b* is imaged into a slit-like region upon the exposure plane 18*a*. The light rays passing through each point inside this region are superposed one upon another at the position that optically serves as a Fourier transform plane with respect to the exposure plane, and this provides the angular characteristic of illumination light in the scan operation. As compared with the first embodiment that necessitates measurements at plural points, in the second embodiment the angular characteristic of illumination light in the scan operation is obtainable through a single measurement.

Where the effective light source of illumination light at any point on the exposure plane 18*a* other than the optical axis La position is going to be measured, the masking blade driving means 31 may actuate the masking blade 12 to define a slit-like opening 12*b* being elongated in the scan direction at an image height, of the point just to be measured, in the masking blade plane. In addition to this, the stage 20 may be driven to move the two-dimensional sensor array 52 to a predetermined position.

In the first and second embodiments described above, in place of restricting the illumination light by use of a masking blade, a light blocking plate having a small opening or a slit-like opening may be provided in the same plane as the exposure plane 18*a*, and the light passing through this opening may be received by illuminance distribution measuring means. As a further alternative, a light blocking plate having a small opening or slit-like opening may be provided at the mask 14 surface position and, by using a mechanism for moving it along the same plane as of the mask 14 surface, similar measurement as described above can be achieved.

[Embodiment 3]

A third embodiment of the present invention will be described below. In projection exposure apparatuses, the effective light source distribution which is very the objective to be measured is the distribution of numerical aperture NA=sin θ (θ is incidence angle). In practical mesurement, however, since the measurement is carried out in a plane which is at a position being displaced from the exposure plane, if the measurement is done in the area with a regular pitch, what can be measured is the distribuiton of tan θ. The error resulting from this is, for example, as follows.

If NA is 0.2, tan θ=0.204 (2% error).
If NA is 0.8, tan θ=1.33 (67% error).

Namely, a large error occurs when NA is large. In accordance with the present embodiment, in consideration of this, the measurement is carried out at a position where NA is small or smaller, by which the error described above is made very small.

Figure 6:
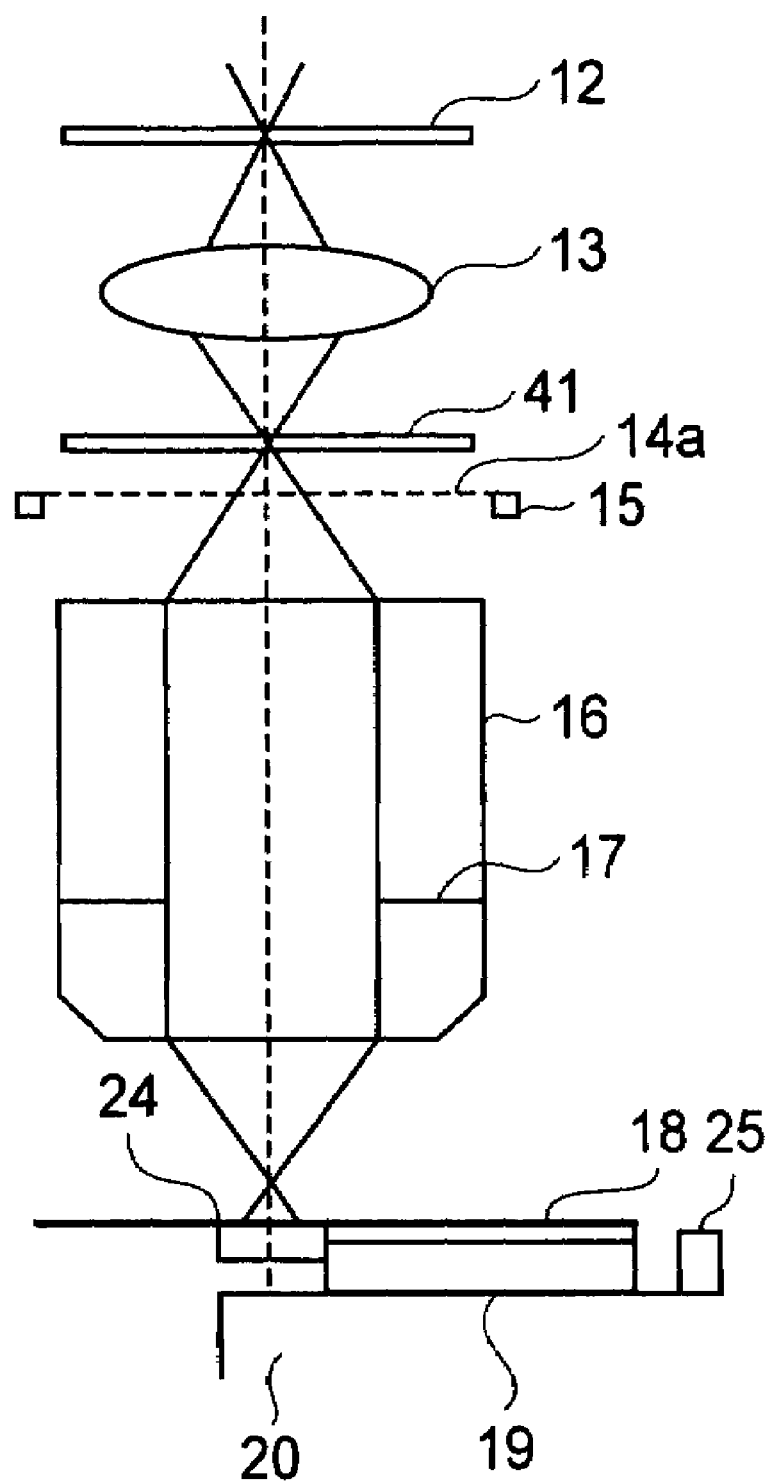
FIG. 6 is a fragmentary view of a portion of FIG. 1, which is arranged in accordance with a third embodiment of the present invention.

FIG. 6 illustrates a portion of the scan type exposure apparatus of FIG. 1, but it is arranged in accordance with the third embodiment of the present invention. The transfer magnification from mask to wafer is made less than 1. Hence, the NA on the mask surface is smaller than the NA on the wafer surface. For example, if the magnification is ¼, the NA on the mask surface is a quarter of the NA on the wafer surface. Thus, a light blocking plate 41 having an aperture stop is provided at a position which is displaced from the mask surface 14*a* by a predetermined amount in the optical axis direction. By setting a small opening as this aperture stop, the effective light source distribution on the mask surface is obtainable. Since the mask surface 14*a* and the exposure plane 18 are conjugate with each other, a similar effective light source distribution is obtainable upon the exposure plane. By measuring the light intensity distsriubtion on the exposure plane by use of a detector 24, such effective light source distribution can be measured. The measurement process described above is repeatedly carried out with respect to plural positions described with reference to the first embodiment, and the results of measurements are integrated by use of calculating means. With this precedure, the angular characteristic of illumination light in the scan operartion can be detected.

If the measurement is carried out at a position where the NA is not greater than 0.25, the above-described error can be suppressed to 4% or less, and thus an effective light source distribution very close to an actual distribution is obtainable. While in this embodiment the intensity distribution is measured upon the exposure plane, what is obtainable therefrom is the light intensity distribution at a position displaced from the mask by a predetermined distance, and thus the measurement can be done at a position where NA is small.

Although the third embodiment has been described with reference to an example applied to a scan type exposure apparatus, the above-described method can be applied also to a step-and-repeat exposure apparatus. Even in that occasion, an effective light source more closer to an actual distribution is obtainable, as compared with conventional methods.

Furthermore, while in this embodiment the position of the aperture stop is set at a position displaced from the mask surface by a predetermined distance, since the mask and the masking blade are conjugate with each other, the aperture stop may be provided at a position displaced from the masking blade position by a predetermined distance.

Once the effective light source during the scan can be measured precisely in accordance with any one of the first, second and third embodiments of the present invention described hereinbefore, correction can be carried out on the basis of the results of measurement and the illumination light can be supplied with an optimum angle. The correction may be carried out in accordance with a method disclosed in Japanese Laid-Open Patent Application, Publication No. 11-087232 and corresponding U.S. Pat. No. 6,333,777.

In accordance with the first to third embodiments of the present invention described hereinbefore, the effective light source of illumination light can be measured while taking into account the influences of the scan. Thus, correction can be done on the basis of the results of measurement, such that the illumination light can be supplied with an optimum angle. Therefore, in accordance with the present invention, an exposure apparatus by which various patterns formed on a mask surface can be projected stably onto a wafer surface wigh high resolving power, is accomplished.

[Embodiment 4]

Next, an embodiment of a device manufacturing method which uses an exposure apparatus according to any one of the embodiments described above, will be explained.

Figure 7:
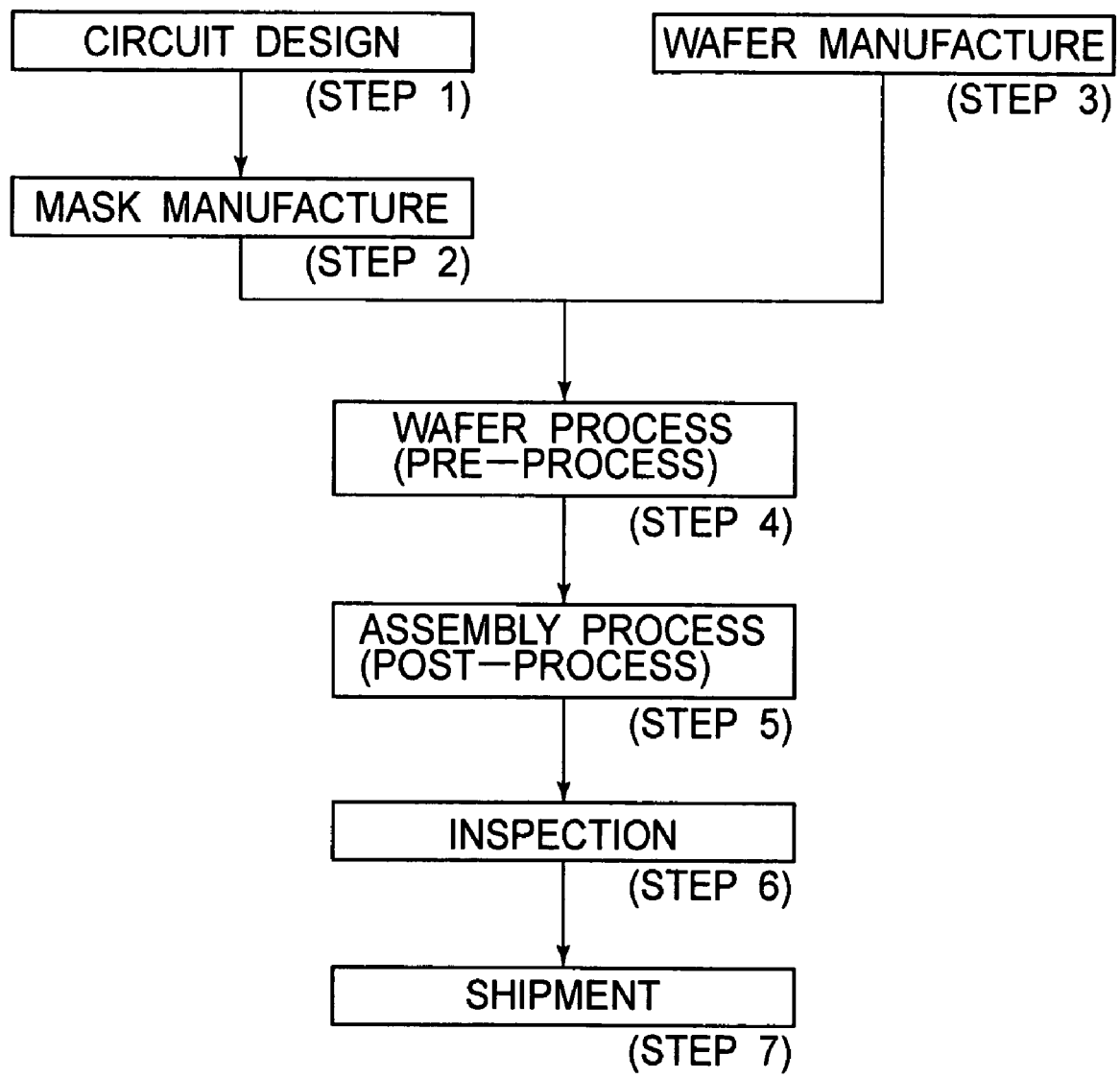
FIG. 7 is a flow chart for explaining device manufacturing processes.

FIG. 7 is a flow chart for explaining the procedure of manufacturing various microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 8:
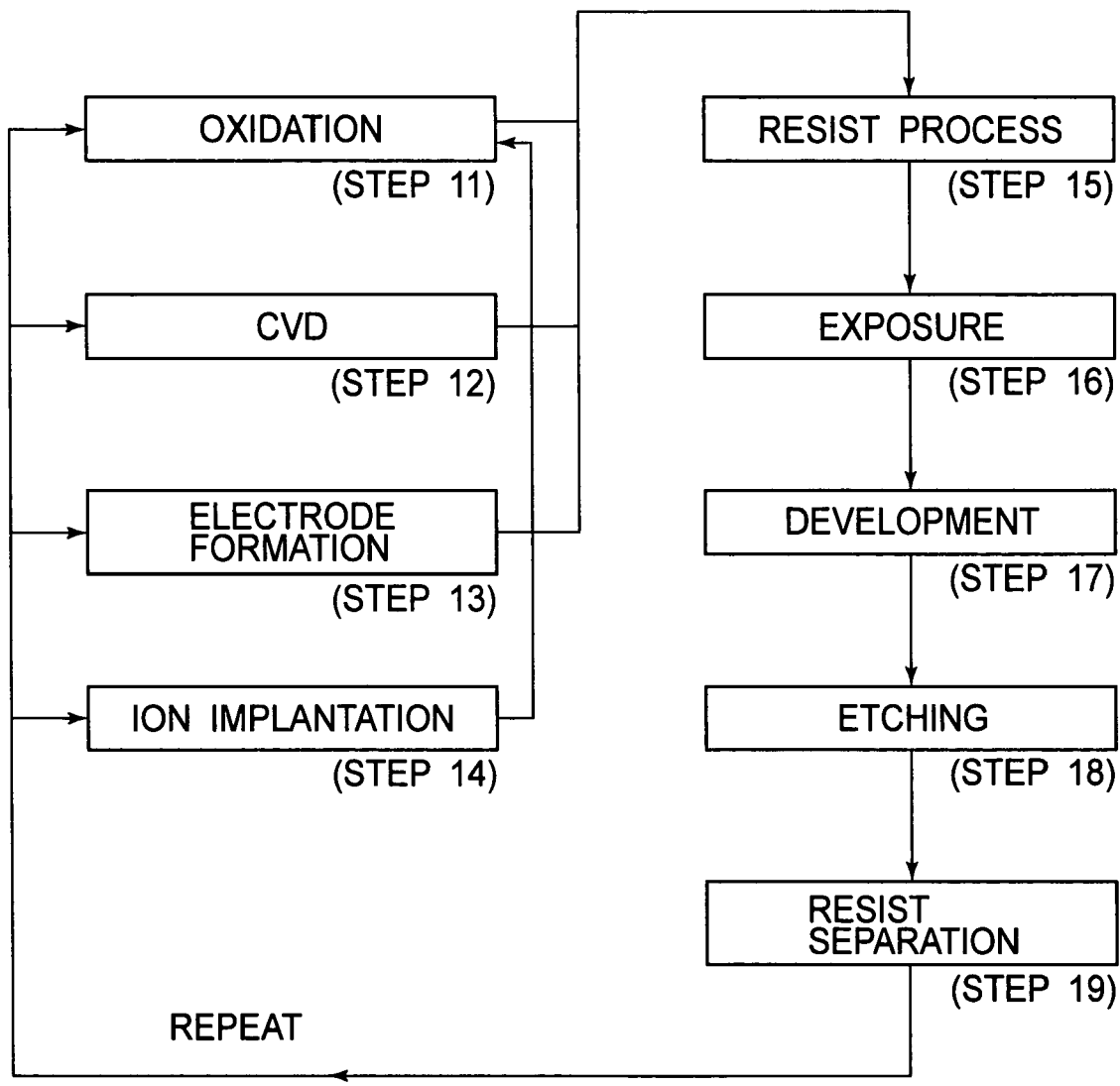
FIG. 8 is a flow chart for explaining details of a wafer process included in the procedure of FIG. 7.

FIG. 8 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2004-113142 filed Apr. 7, 2004, for which is hereby incorporated by reference.

What is claimed is:

1. A scan type exposure apparatus for exposing a substrate, placed on an exposure plane, to a pattern of a mask with light from a light source, said apparatus comprising:
   a stop member for restricting an exposure range on the exposure plane;
   measuring means for measuring an illuminance distribution which is produced on a predetermined plane displaced from the exposure plane in an optical axis direction and by a predetermined amount and which is provided by light passed through an opening of said stop member and projected or to be projected at a predetermined position on the exposure plane; and
   calculating means for calculating an angular characteristic of light projected or to be projected on the exposure plane, on the basis of integrating illuminance distributions which are defined by lights incident at plural positions along a scan direction upon the exposure plane and which are measured by said measuring means.

2. An apparatus according to claim 1, wherein said measuring means is adapted to measure the illuminance distributions, defined by the lights incident on the plural positions, independently of each other.

3. An apparatus according to claim 1, wherein the opening of said stop member has a variable shape, and wherein, for the measurement with said measuring means, the shape of the opening is made into a hole-like shape.

4. An apparatus according to claim 1, wherein the opening of said stop member has a slit-like shape being elongated in the scan direction.

5. An apparatus according to claim 1, wherein the opening of said stop member has a variable shape, and wherein, for the measurement with said measuring means, the shape of the opening is made into a slit-like shape being elongated in the scan direction.

6. An apparatus according to claim 1, wherein said measuring means includes a detector for detecting intensity of light, and wherein said detector is movable in a direction perpendicular to an optical axis to measure the illuminance distribution.

7. An apparatus according to claim 1, wherein said measuring means includes a sensor array which is movable in a direction perpendicular to an optical axis to measure the illuminance distribution.

8. An apparatus according to claim 1, wherein said measuring means includes a two-dimensional sensor array.

9. A scan type exposure apparatus for exposing a substrate, placed on an exposure plane, to a pattern of a mask with light from a light source, said apparatus comprising:
   a stop member having a slit-like opening elongated in a scan direction, for restricting an exposure range on the exposure plane;
   a two-dimensional sensor array disposed at a position corresponding to a Fourier transform plane with respect to the exposure plane; and
   a detector for detecting an intensity distribution, on the Fourier transform plane, of light passed through the slit-like opening of said stop member.

10. A device manufacturing method, comprising the steps of: exposing a substrate by use of an exposure apparatus as recited in claim 1; and developing the exposed substrate.

11. A device manufacturing method, comprising the steps of: exposing a substrate by use of an exposure apparatus as recited in claim 9; and developing the exposed substrate.

12. An apparatus according to claim 9, wherein the opening of said stop member has a variable shape, and wherein, for the detection with said detector, the shape of the opening is made into the slit-like shape.

* * * * *